United States Patent

Bak et al.

Patent Number: 5,376,463
Date of Patent: Dec. 27, 1994

[54] ANISOMETRIC METAL NEEDLES WITH L-SHAPED CROSS-SECTION

[75] Inventors: Chan S. Bak, Newbury Park; Leroy J. Miller, Canoga Park; Camille I. Van Ast, Newbury Park, all of Calif.

[73] Assignee: Hughes Aircraft Company, Los Angeles, Calif.

[21] Appl. No.: 124,777

[22] Filed: Sep. 20, 1993

Related U.S. Application Data

[62] Division of Ser. No. 911,825, Jul. 10, 1992, which is a division of Ser. No. 674,987, Mar. 26, 1991, Pat. No. 5,179,993.

[51] Int. Cl.⁵ .............................................. B22F 9/00
[52] U.S. Cl. .............................. 428/547; 428/546; 428/605; 428/606; 428/607; 428/610; 428/611; 428/615; 252/255; 252/572
[58] Field of Search .............. 252/572; 428/605, 606, 428/607, 610, 611, 615, 546, 547; 75/255

[56] References Cited

U.S. PATENT DOCUMENTS

| | | | |
|---|---|---|---|
| 3,040,625 | 6/1962 | Zito, Jr. ............................ | 88/61 |
| 3,367,872 | 2/1968 | Martinek et al. ................. | 252/74 |
| 3,385,793 | 5/1968 | Klass et al. ....................... | 252/75 |
| 3,412,031 | 11/1968 | Martinek et al. ................. | 252/75 |
| 3,427,247 | 2/1969 | Peck ................................. | 252/75 |
| 3,655,267 | 4/1972 | Forlini ............................. | 350/150 |
| 3,813,265 | 5/1974 | Marks ............................. | 117/211 |
| 4,400,432 | 8/1983 | Buxbaum et al. ............... | 428/403 |
| 4,543,207 | 9/1985 | Sato ................................. | 252/570 |
| 4,737,886 | 4/1988 | Pedersen ......................... | 361/225 |
| 4,776,868 | 10/1988 | Trotter, Jr. et al. ............. | 65/18.2 |
| 5,104,745 | 4/1992 | Cave et al. ...................... | 428/607 |
| 5,179,993 | 1/1993 | Bak et al. ........................ | 164/46 |
| 5,217,638 | 6/1993 | Hattori et al. ................... | 252/74 |
| 5,252,441 | 10/1993 | James et al. .................... | 430/496 |
| 5,296,155 | 3/1994 | Reitz ................................ | 252/73 |
| 5,308,552 | 5/1994 | Bak et al. ........................ | 252/570 |
| 5,316,687 | 5/1994 | Bloink et al. .................... | 252/71 |
| 5,320,770 | 6/1994 | Conway et al. ................. | 252/75 |
| 5,320,910 | 6/1994 | Banno et al. .................... | 428/546 |

FOREIGN PATENT DOCUMENTS 0004900 10/1979 European Pat. Off. .

*Primary Examiner*—Donald P. Walsh
*Assistant Examiner*—Daniel Jenkins
*Attorney, Agent, or Firm*—V. D. Duraiswamy; W. K. Denson-Low

[57] ABSTRACT

A grating (22) of narrow parallel ridges (24) is formed in the surface (26) of a substrate (20) made of a hard material such as silicon dioxide. Metal (40) is deposited onto the grating (22) perpendicular to the ridges (24) at an angle of approximately 45° to the surface (26) of the grating such that the metal (40) is deposited onto the top (24a) and one of the sides (24b) of the each of the ridges (24) to form generally L-shaped metal strips (12') thereon. The metal strips (12') are cut at periodic intervals along the ridges (24) to produce anisometric metal needles (12). The substrate (20) is immersed in a dielectric fluid (14), and ultrasonic energy is applied to cause the needles (12) to release from the substrate (20) into suspension in the fluid (14). The L-shape of the needles (12) makes them resistant to bending. The suspension (10) has birefringent properties similar to liquid crystals, but may be electrically switched at much higher speed. The index of refraction of the suspension (10) varies in accordance with the alignment of the needles (12), thereby enabling the direction and phase of an electromagnetic wave propagating through the suspension (10) to be controlled by varying the magnitude of the applied electric field.

8 Claims, 4 Drawing Sheets

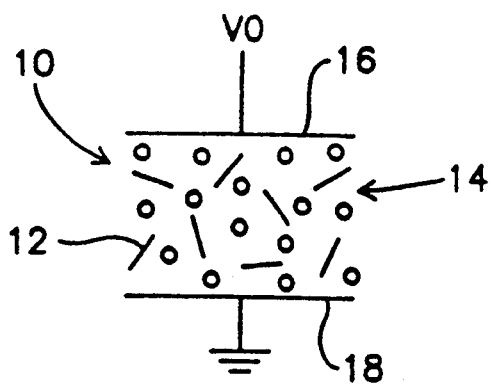
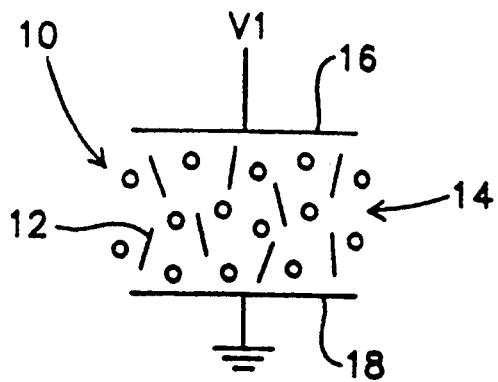
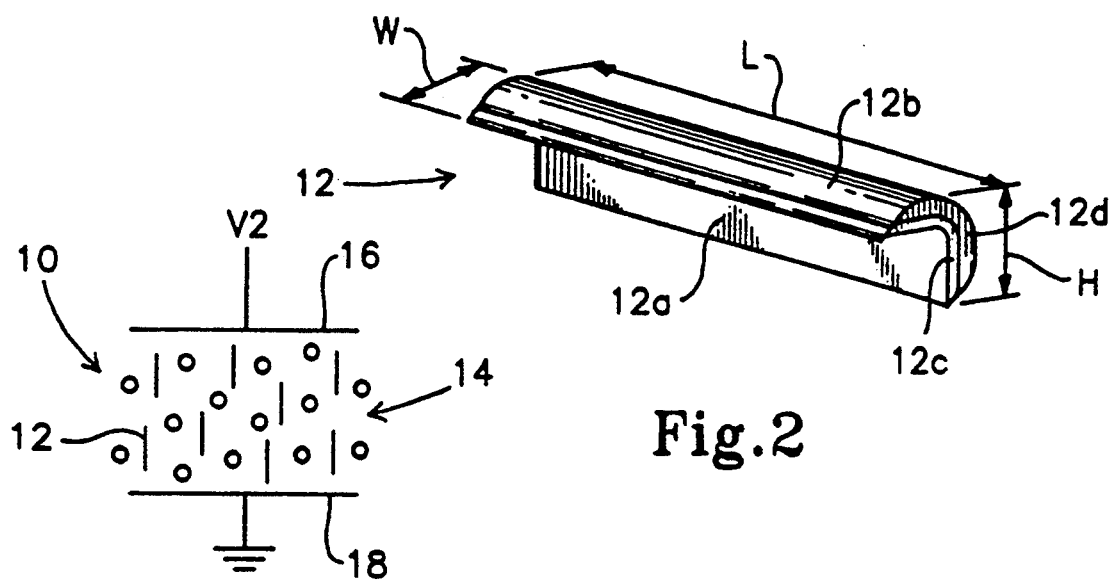
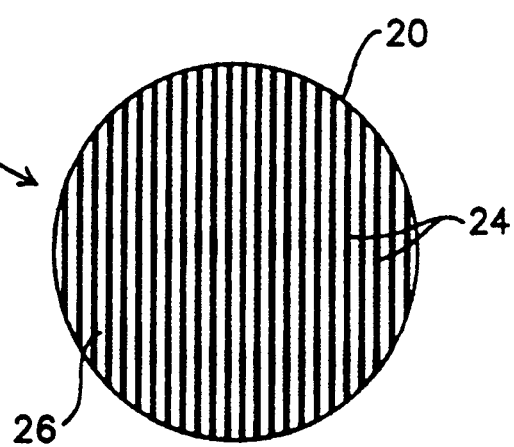
Fig.1a  Fig.1b  Fig.2  Fig.1c  Fig.3

ANISOMETRIC METAL NEEDLES WITH L-SHAPED CROSS-SECTION

This is a division of application Ser. No. 07/911,825 filed Jul. 10, 1992, which was a division of application Ser. No. 07/674,987 filed Mar. 26, 1991 now issued as U.S. Pat. No. 5,179,993.

BACKGROUND OF THE INVENTION

1. Field of the Invention

The present invention generally relates to electronic and electro-optic devices, and more particularly to the fabrication of anisometric metal needles for a birefringent suspension in a dielectric fluid.

2. Description of the Related Art

Devices for beam steering, beam focusing, waveguiding, and phase shifting are essential components of radar and communications systems.

Ferrites and diode arrays are generally used as phase shifters in microwave radar systems, as described in a textbook entitled "RADAR HANDBOOK, 2nd Edition", by M. Skolnik, ed., Mc-Graw Hill Publishing Co., 1990, pp. 7.63–7.67. These devices work well for narrow, tuned spectral bands, but not for the wide bands desired for frequency-agile systems. The phase shift of ferrites is sensitive to operating temperatures. The high power consumption of diodes prohibits their use for high power microwave antennas. These existing types of phase shifters are also expensive, which is a major concern in an application such as a phased array radar system in which thousands of phase shifters may be required.

Beam steering devices for the infrared region generally include liquid crystals as birefringent elements, but these are relatively slow for advanced electro-optic applications.

SUMMARY OF THE INVENTION

The present invention provides a method of producing a birefringent suspension of anisometric metal needles in a dielectric fluid, which can be used as a controlling element in beam steering, beam focusing, waveguiding, and phase shifting devices for electronic and optical applications. Where the length of the needles is very small relative to the wavelength of the electromagnetic waves being controlled, the needles act as dipoles having very large dipole moment. This enables the orientation of the needles in the fluid to be shifted from a random state in the absence of an electric field to an aligned state upon application of an electric field in a very short period of time, on the order of milliseconds.

The index of refraction of the suspension varies in accordance with the alignment of the needles, thereby enabling the phase of an electromagnetic wave propagating through the suspension to be controlled by varying the magnitude of the applied electric field.

The present suspension has birefringent properties similar to liquid crystals, but may be electrically switched at much higher speed. The L-shape of the needles makes them resistant to bending. The suspension is especially suited for use as a lens or waveguide for the infrared to microwave region of the electromagnetic spectrum, exhibiting a flat response curve over wide spectral regions. Microwave applications include near object detection (NOD), true ground speed sensing, and other radar systems for automotive vehicles.

In accordance with the present method of fabricating anisometric needles and a suspension thereof in a dielectric fluid, a grating of narrow parallel ridges is formed in the surface of a substrate made of a hard material such as silicon dioxide. Metal is deposited onto the grating at an angle of approximately 45° to the surface of the grating and perpendicular to the ridges of the grating such that the metal is deposited onto the top and one of the sides of each of the ridges to form generally L-shaped metal strips thereon. The metal strips are cut at periodic intervals along the ridges to produce the needles. To form a suspension directly, the substrate is immersed in a dielectric fluid, and ultrasonic energy is applied to cause the needles to release from the substrate into suspension in the fluid. To form a mass of needles, the substrate is immersed in a solvent and the needles caused to be released from the substrate into suspension in the solvent. The solvent is then evaporated or otherwise removed to leave the mass of needles, which may be stored and transported in dry form, and subsequently mixed into a dielectric fluid for use.

These and other features and advantages of the present invention will be apparent to those skilled in the art from the following detailed description, taken together with the accompanying drawings, in which like reference numerals refer to like parts.

DESCRIPTION OF THE DRAWINGS

FIGS. 1a to 1c are diagrams illustrating how the index of refraction of a birefringent suspension of anisometric metal needles fabricated in accordance with the present method can be varied by means of an applied electric field;

FIG. 2 is a perspective view of an anisometric metal needle fabricated in accordance with the present method;

FIG. 3 is a simplified plan view of a substrate formed with a grating of parallel ridges for practicing the present method;

DETAILED DESCRIPTION OF THE INVENTION

Figure 4:
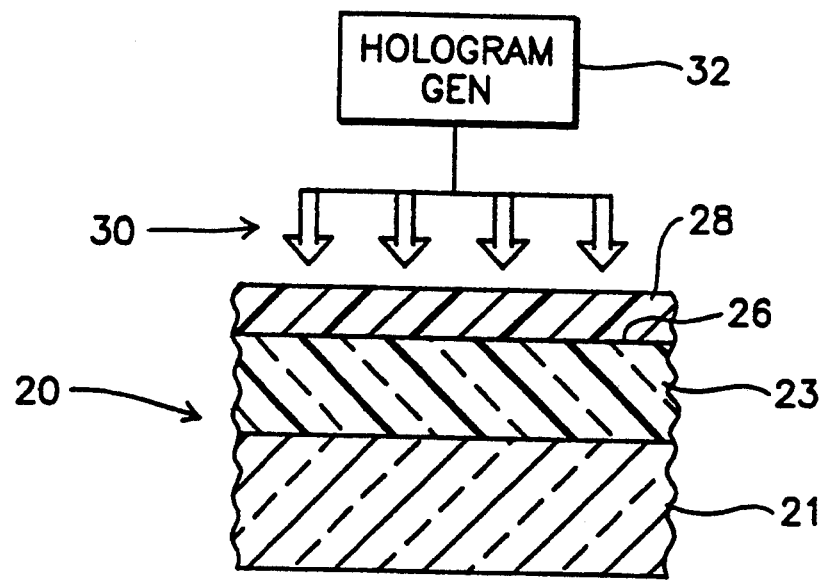
FIGS. 4 to 8 are simplified fragmentary sectional views illustrating steps of the present method.

In accordance with the present invention, metal needles are suspended in a dielectric fluid to achieve high birefringence with fast response time and low voltage and low drive power activation. The needles create optical birefringence in the fluid in a manner similar to that of the directors in a liquid crystal material. When the length L of a metal needle is more than an order of magnitude smaller than the wavelength of an incident electromagnetic wave, the metal needle exhibits induced dielectric dipole moment characteristics.

The phenomenon which makes the needle act as a dipole and not as a conductive wire is that the current induced in the needle in response to an applied electrical potential E is proportional to $dE/dt$. A constant value of E generates only transient current, which produces a positive or negative electric charge Q at the opposite ends of the needle. The charge Q generates a field, which when superimposed on the external field, produces a zero internal field. Conversely, in a wire there is a constant current for a constant field. The phase of the current in the needle is shifted by 90° relative to the field, enabling the suspension to produce optical phase modulation. In a wire, the current is in phase with the electric field.

The needles in the present suspension are designed to have an aspect ratio (length to width ratio) in excess of five and preferably ten or more. The dipole moment has a value of QL, which is the same as for a molecular dielectric dipole moment. In the case of the needle, the charge Q is proportional to the applied potential E, and the length L is constant. Conversely, for a permanent dielectric dipole moment, Q is constant.

There is also a large difference in the magnitude of the dipole moment. In a typical dielectric dipole, L is of molecular size (10–100 Angstroms), whereas in the case of the present needles, L is much larger, on the order of 5,000–40,000 Angstroms. The value of Q for a dielectric dipole is usually equal to one molecular charge, or one electron. In the case of a needle, the value of Q may be on the order of $10^{15}$ electrons. The dipole moment associated with a metal needle is therefore very large compared to molecular dipole moments.

A birefringent suspension according to the present invention may be used in several different modes of operation, an exemplary one of which is illustrated in FIGS. 1a to 1c. The birefringent suspension fabricated in accordance with the present invention is designated as 10, and includes a plurality of anisometric metal needles 12 suspended in a dielectric fluid 14 which is collectively designated by circles in the drawings. An electric field may be applied across the suspension 10 by means of electrodes 16 and 18. For a low value V0 (such as zero volts) of electrical potential applied to the electrodes 16 and 18, the needles 12 will be randomly aligned in the fluid 14 as in FIG. 1a, and the suspension 10 will have a relatively high index of refraction.

In response to a large value of V2 of applied electrical potential, the needles 12 will be aligned with the electric field, as shown in FIG. 1c. Assume that the direction of propagation of the electromagnetic wave is perpendicular to the plane of the paper in the drawing. The suspension 10 will have a relatively low index of refraction if the plane of polarization is perpendicular to the long axis of the needles, and a relatively high refractive index if the plane of polarization is parallel to the long axis of the needles. For an intermediate value V1 of applied electrical potential (FIG. 1b), the needles will be partially aligned and the index of refraction will have an intermediate value between those produced by the potentials V0 and V2.

An anisometric metal needle 12 fabricated in accordance with the present invention is illustrated in FIG. 2. The needle 12 has a generally L-shaped cross section. However, the needles 12 need not necessarily have sharp angled sides, but may have a curved, crescent shape. The cross-section of the needles 12 has an inwardly facing, concave surface 12a, and an outwardly facing, convex surface 12b.

Although the needle 12 may be constituted by a single piece of metal, it is preferably formed of two layers to facilitate fabrication using the present method. The needle 12 as illustrated in FIG. 2 includes a first metal layer 12c, and a second metal layer 12d formed on the outwardly facing convex surface of the first metal layer 12c. In a preferred embodiment of the needle 12, the first metal layer 12c is formed of copper, and the second metal layer 12d is formed of aluminum.

Although the needles 12 can be made from any good electrical conductor, aluminum is the most preferred material. It is an excellent conductor, and its density can be matched to suitable dielectric fluids. The density of the needles 12 need not necessarily be matched exactly to the density of the liquid, but will preferably be close to it. Also, the surface of aluminum is spontaneously oxidized in air to a depth of about 50 Angstroms, although this can be increased to about 150 Angstroms by heating if desired. The oxidation is self-limiting in that it does not continue readily beyond this point.

Another applicable metal is magnesium. It is chemically less stable in suspension, but lighter than aluminum, and thereby less difficult to match to the density of a dielectric fluid.

Aluminum is not a ferromagnetic material. For applications in which a ferromagnetic material is desired, the preferred materials are iron or nickel. Iron and nickel have densities greater than that of all available dielectric fluids, but the average density of the needles can be reduced by coating them with a low-density polymer.

The length L of the needle 12 is preferably at least five and more preferably ten times the width W and height H thereof, with W and H being approximately equal, as illustrated in FIG. 2. The length L is between approximately 5,000–40,000 Angstroms, and the width W and height H are between approximately 500–10,000 Angstroms. The thickness of the needles 12, equal to the combined thicknesses of the layers 12c and 12d, is between approximately 200–3,000 Angstroms. Where copper and aluminum are used for the layers 12c and 12d respectively, the thickness of the copper layer 12c is between approximately 10–100 Angstroms and the thickness of the aluminum layer 12d is between approximately 100–3,000 Angstroms.

The needles 12 constitute between approximately 0.01%–10% of the suspension by volume. The dielectric fluid 14 may include any stable, organic dielectric liquid, including ketones, alcohols, esters, aliphatic and aromatic hydrocarbons, aliphatic and aromatic halocarbons, aldehydes, amines, and combinations thereof. However, for applications in which the birefringence of the suspension 10 is important, the fluid 14 should have low absorption of the electromagnetic radiation that is being controlled.

For the millimeter wave and microwave regions of the electromagnetic spectrum, it can be important for the fluid 14 to have substantially no permanent dipole, since molecules with permanent dipoles absorb some of the radiation in these regions. Molecules that have no permanent dipole include aliphatic hydrocarbons, aliphatic perfluorocarbons, and symmetrically substituted organic molecular materials.

For these applications, specific preferred liquids are aliphatic hydrocarbons including pentane, hexane, heptane, octane, nonane, decane, undecane, dodecane, tridecane, tetradecane, pentadecane, hexadecane, and isomers thereof. Other preferred liquids are cycloaliphatic hydrocarbons including cyclohexane and decalin.

Further preferred liquids are symmetrical aromatic hydrocarbons including benzene, para-xylene, mesitylene, and 1,3,5-triethylbenzene. Carbon tetrachloride is also a suitable liquid.

To stabilize the suspension of the needles 12 in the fluid 14, it is desirable to use liquids with a density as close as possible to that of the metal of the needles. For this reason, it may be desirable to utilize fluids with high density. This may be accomplished by including one or more solid organic dielectric materials in one or a combination of the preferred dielectric liquids. Preferred solid organic materials for this purpose which have a symmetrical chemical structure and no permanent dipole include carbon tetrabromide, para-dichlorobenzene, 1,3,5-trichlorobenzene, 1,2,4,5-tetrachlorobenzene, 1,3,5-tribromobenzene, and 1,2,4,5-tetrabromobenzene.

For applications in the infrared region of the electromagnetic spectrum, it is usually not important for the liquid to consist of molecules with no permanent dipole moment. It is only important for the liquid to have low absorption in the operating wavelength range. For such applications, very dense liquids, such as bromoform, 1,1,2,2-tetrabromoethane, and 1,1,1,2-tetrabromoethane may be suitable.

The choice of metal or metals for the needles 12, and the liquid or combination of liquids for the fluid 14, depends on the particular application, and on the stability of the needles 12 in the fluid 14. The present invention should not be construed as limited to the particular metals or dielectric liquids listed above.

A method of fabricating a mass of the needles 12, and the suspension 10 including the needles 12 suspended in the dielectric fluid 14, will now be described with references to FIGS. 3 to 10 of the drawings.

FIG. 3 illustrates a substrate 20 formed with a grating 22 of parallel ridges 24 formed on a surface 26 of the substrate 20. The surface 26 is considered to be the base plane of the upper peripheral boundary of the substrate 20 as viewed in the drawings, and is defined by different material layer structures as the processing proceeds. Preferably, the grating 22 is formed in such a manner that the substrate 20 may be cleaned and reused for practicing the present method many times. Only a few ridges 24 are shown as being formed on the surface 26 of the substrate 20 in FIG. 3 for clarity of illustration. However, it will be understood that in actual practice of the present method, a much larger number of ridges will be formed thereon.

The substrate 20 may be formed entirely of an oxide of silicon, such as silicon dioxide, or silicon nitride, or include a silicon wafer with the surface 26 subjected to a suitable oxidization process. Although materials other than silicon oxides may be used, it is necessary that the grating 22 be sufficiently rigid and durable to practice the present method at least once.

Figure 5:
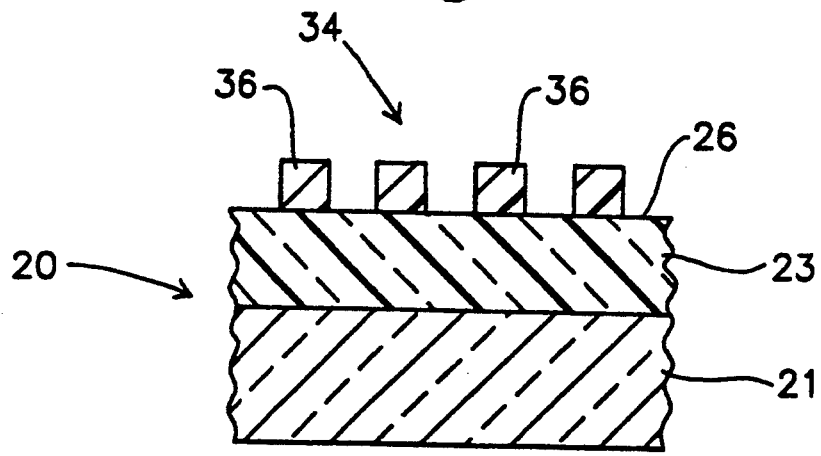
Figure 6:
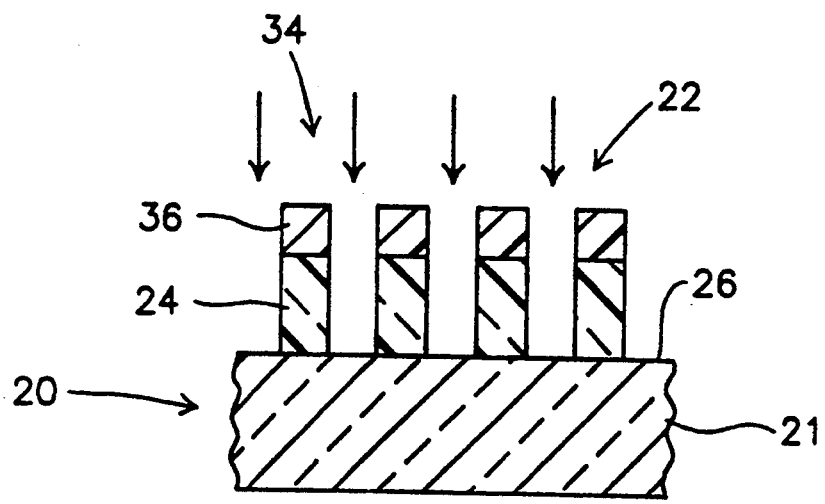

The grating 22 may be formed in the surface 26 of the substrate 20 as illustrated in FIGS. 4 to 6. As shown, the substrate 20 includes a silicon wafer 21, and a layer 23 of silicon dioxide approximately 5,000 Angstroms thick formed on the wafer 21. In FIG. 4, a layer of photoresist 28 is deposited on the surface 26, and exposed to an optical pattern 30 which corresponds to the grating 22. The pattern 30 may be generated holographically using a laser hologram generator 32, or any other optical means.

As illustrated in FIG. 5, the photoresist 28 is developed to form a photoresist pattern 34 consisting of ridges 36 which were not removed by the developer solution. Typically, the period of the pattern 30, corresponding to the lateral spacing between the centers of adjacent ridges 24, may be on the order of 5,000 Angstroms, with the widths of the ridges 24 being approximately equal to the spaces between the ridges 24. For smaller needles, gratings with smaller periods must be used.

In FIG. 6, an etchant is applied to etch the surface 26 of the substrate 20 in the areas of the photoresist pattern 34 which were removed by the developer, and which are thereby not covered by the ridges 36. The etching forms depressions which define the ridges 24 therebetween. The etching will typically be performed so that the ridges 24 will have a height of approximately 5,000 Angstroms. Where the silicon dioxide layer 23 is 5,000 Angstroms thick, the etching will cut through the oxide layer 23 down to the underlying silicon, such that the upper surface of the silicon wafer 21, which is not affected by the etchant, now defines the surface 26. The photoresist pattern 34 is then stripped away to produce the substrate 20 as illustrated in FIG. 3. A number of photoresists, developers, and etchants suitable for performing the steps of FIGS. 5 and 6 are commercially available, and the choice thereof is not critical to the practice of the invention.

Figure 7:
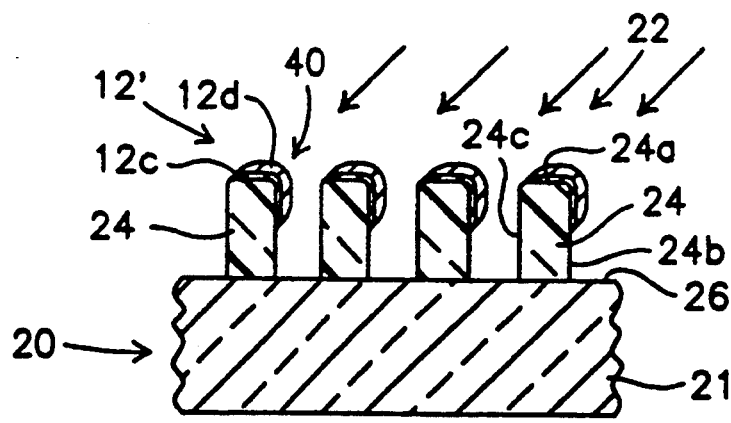

As illustrated in FIG. 7, metal 40 is deposited onto the grating 22 to form generally L-shaped metal strips 12' which extend perpendicular to the plane of the drawing and will be cut as described below to produce the metal needles 12. The metal 40 is preferably deposited at an angle of about 90° to the ridges 24, and an angle of approximately 45° to the surface 26 as illustrated by arrows. A preferred deposition process is electron beam evaporation, although the invention is not so limited. The ridges 24 have tops 24a, first sides 24b, and second sides 24c. The metal 40 is deposited to form the first layer 12c and second layer 12d described above and illustrated in FIG. 2. The first layer 12c is first evaporated onto the tops 24a and upper portions of the first sides 24b of the ridges 24. The first layer 12c is preferably copper, and is provided to facilitate removal of the needles 12 from the surface 26 after fabrication. Where removal is not a problem, the first layer 12c may be omitted. The second layer 12d, preferably of aluminum, is then evaporated onto the first layer 12c.

The first layer 12c may be deposited to a preferred thickness of 50 Angstroms, but the thickness thereof may have a value between approximately 10–100 Angstroms within the scope of the invention. The second layer 12d may be deposited to a preferred thickness of between approximately 750–1000 Angstroms, but the thickness thereof may have a value between approximately 100–3000 Angstroms within the scope of the invention.

The angle of deposition relative to the surface 26 is approximately 45°, but may vary within a range in which the metal 40 is deposited to a sufficient extent onto the first sides 24b of the ridges 24, but not in the spaces between adjacent ridges 24. Where the period and depth of the grating 22 are both approximately 5,000 Angstroms, the width W and height H of the metal strips 12' will be approximately 2,500 Angstroms, although these values may vary from between approximately 500–10,000 Angstroms within the scope of the invention.

Figure 8:
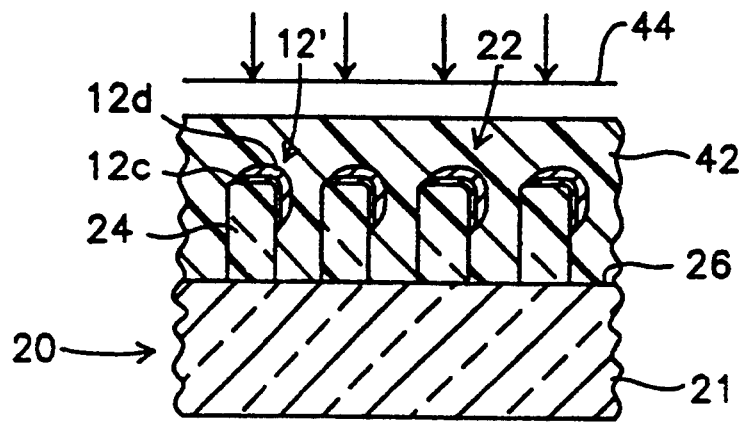
Figure 9:
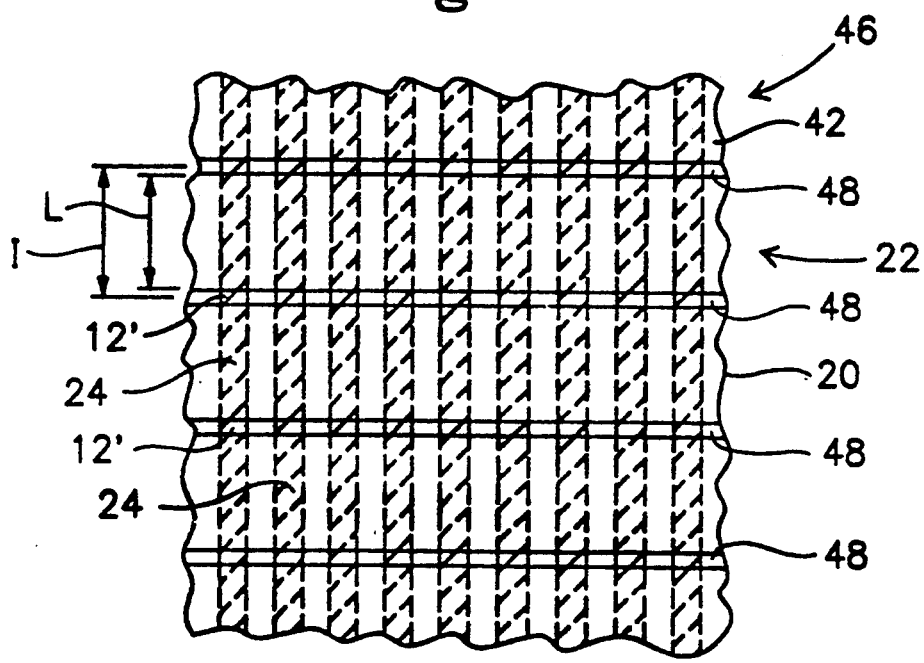
FIGS. 9 and 10 are simplified fragmentary plan views illustrating further steps of the present method.
Figure 10:
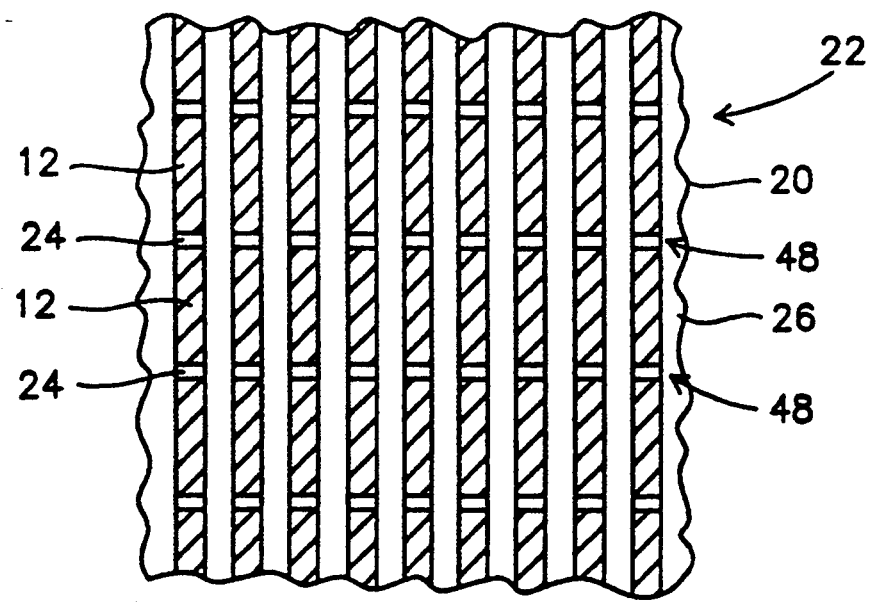

FIGS. 8, 9 and 10 illustrate the steps for cutting the metal strips 12' at periodic intervals I along their lengths to produce the metal needles 12. In FIG. 8, a photoresist layer 42 is formed on the surface 26 of the substrate 20 to cover the metal strips 12' and is exposed to an optical pattern of parallel lines as indicated at 44. The lines 44 extend perpendicular to the ridges 24, and are spaced from each other by the periodic intervals I which correspond to the desired length L of the needles 12. As shown in FIG. 9, each interval I is equal to L plus the width of each line 44.

In FIG. 9, the photoresist 42 is developed to form a photoresist pattern 46 including areas 48 corresponding to the lines 44 in which the photoresist 42 is removed by the developer solution. The metal strips 12' and surface 26 of the substrate 20 are thereby exposed in the areas 48. In FIG. 10, an etchant is applied to the surface 26 which etches through the layers 12c and 12d of the metal strips 12' in the exposed areas 48 and thereby cuts the strips 12' into the desired length L. The etchant does not, however, affect the silicon dioxide ridges 24 of the grating 22, or the underlying bulk of the silicon substrate 20. The photoresist 42 is then stripped away to leave the resulting needles 12 adhered to the tops 24a and first sides 24b of the ridges 24. The length L of the needles 12 is preferably between approximately 10,000-30,000 Angstroms, but may vary from between approximately 5,000-40,000 Angstroms within the scope of the invention.

A number of photoresists, developers, and etchants suitable for performing the steps of FIGS. 8 to 10 are commercially available, and the choice thereof is not critical to the practice of the invention. The etchant used in the step of FIG. 10 may be a commercial aluminum etching solution including an acid or mixture of acids. Alternative etching methods include plasma etching and reactive ion etching.

Figure 11:
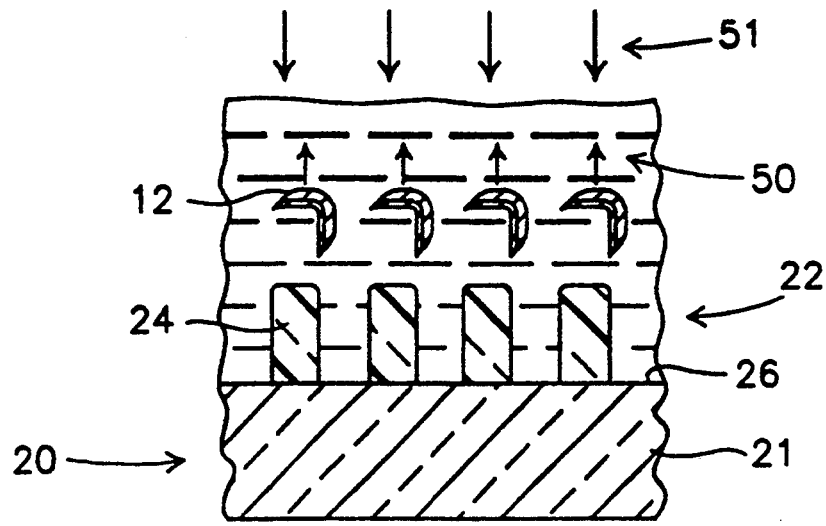
FIG. 11 is a simplified fragmentary sectional view illustrating a final step of the present method.
Figure 12:
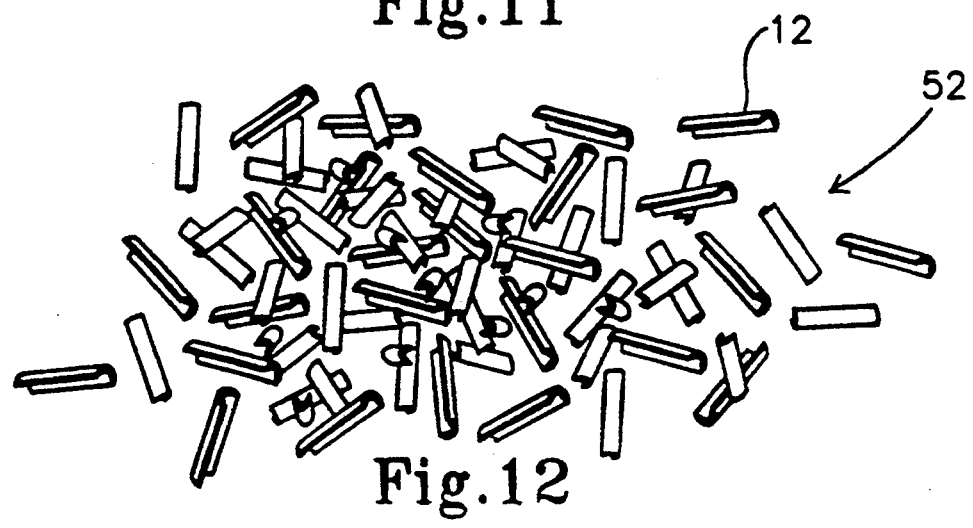
FIG. 12 is a plan view illustrating a mass of separate needles fabricated in accordance with the present method.

As illustrated in FIG. 11, the substrate 20 is immersed in a solution 50 which may be a solvent such as acetone, isopropyl alcohol, carbon tetrachloride, etc. to release the needles 12 from the substrate 20. Ultrasonic energy 51 may be applied to assist in removal of the needles 12 from the substrate 20. The solvent may be removed from the resulting mixture using evaporation, centrifugal force, or the like to produce a mass 52 of separate needles 12 as illustrated in FIG. 12. The mass 52 may be stored and transported in dry form, and subsequently mixed into any of the dielectric fluids 14 described above to produce the present birefringent suspension 10.

Alternatively, the solution 50 itself may constitute the dielectric fluid 14, in which case the suspension 10 is produced as illustrated in FIG. 11 without the intermediate step of removing the solution 50 from the needles 12. Where the solution 50 (fluid 14) is a solvent such as acetone, the stability of the solution 10 may be enhanced by a residual coating of photoresist 42 which causes the needles 12 to resist flocculation and settling in the fluid 14. Where the needles 12 are suspended in other solvents, it may be desirable to coat them with another polymer material to achieve a similar effect. However, the needles 12 may be stably suspended in a number of the organic dielectric liquids listed above without the necessity of a polymer coating. In any case, the substrate 20 is preferably cleaned for reuse after the needles 12 are removed therefrom.

EXAMPLE

A grating was formed in the surface of a commercial silicon wafer which was 7.6 centimeters in diameter and had a 5,000 Angstrom thick layer of silicon dioxide formed thereon. The grating had a period of 5,000 Angstroms, and a depth of 5,000 Angstroms. A first layer of copper and a second layer of aluminum were deposited on the ridges of the grating at an angle of 45° using electron beam evaporation. The pressure in the evaporation chamber was $10^{-6}$ to $10^{-7}$ mmHg, the temperature of the aluminum source was 600° C. to 700° C., and the deposition rate was approximately 10 Angstroms per second. The copper layer was deposited to a thickness of approximately 100 Angstroms, and the aluminum layer was deposited to a thickness of approximately 750 Angstroms.

The surface of the substrate was coated with AZ-1350B photoresist manufactured by the American Hoechst Company. The photoresist was exposed by contact printing through a mask to an optical pattern of lines extending perpendicular to the ridges of the grating and having a period of approximately 40,000 Angstroms, and developed to expose the underlying metal strips in the areas corresponding to the lines of the optical pattern. A conventional aluminum etchant was used to dissolve the metal strips in the exposed areas. The photoresist was removed using acetone, with minimum agitation so that the metal needles remained undisturbed on the ridges of the grating. The substrate was then immersed in a solution of clean acetone, and ultrasonic energy was applied to release the needles from the grating into solution in the acetone.

Approximately $2.3 \times 10^9$ needles were produced, which had a length of approximately 20,000 Angstroms, width of approximately 2,500 Angstroms, and thickness of approximately 850 Angstroms. The needles remained in stable suspension in the acetone solution without settling for over ten weeks.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. An anisometric metal needle having a generally L-shaped cross-section, a length of between approximately 5,000-40,000 Angstroms, a width of between approximately 500-10,000 Angstroms, and a thickness of between approximately 200-3,000 Angstroms.

2. A needle as in claim 1, comprising:
   a first metal layer having said generally L-shaped cross section which includes a inwardly facing concave surface and an outwardly facing convex surface; and
   a second metal layer formed on said convex surface of the first metal layer.

3. A needle as in claim 2, in which the first metal layer comprises copper, and the second metal layer comprises aluminum.

4. A needle as in claim 3, in which the first metal layer has a thickness of between approximately 10-100 Angstroms, and the second metal layer has a thickness of between approximately 100-3,000 Angstroms.

5. A mass of separate anisometric metal needles, each needle having a generally L-shaped cross-section, a length of between approximately 5,000-40,000 Angstroms, a width of between approximately 500-10,000 Angstroms, and a thickness of between approximately 200-3,000 Angstroms.

6. A mass as in claim 5, in which each metal needle comprises:

a first metal layer having said generally L-shaped cross section which includes an inwardly facing concave surface and an outwardly facing convex surface; and a second metal layer formed on said convex surface of the first metal layer.

7. A mass as in claim 6, in which the first metal layer comprises copper, and the second metal layer comprises aluminum.

8. A mass as in claim 7, in which the first metal layer has a thickness of between approximately 10–100 Angstroms, and the second metal layer has a thickness of between approximately 100–3,000 Angstroms.

* * * * *